United States Patent [19]

Sasov

[11] Patent Number: 5,986,886
[45] Date of Patent: Nov. 16, 1999

[54] THREE-DIMENSIONAL FLEXIBLE ELECTRONIC MODULE

[75] Inventor: Yuriy Dmitrievich Sasov, Moscow, Russian Federation

[73] Assignee: R-Amtech International, Inc., Bellevue, Wash.

[21] Appl. No.: 09/118,883

[22] Filed: Jul. 20, 1998

[30] Foreign Application Priority Data

Nov. 3, 1997 [RU] Russian Federation ............. 97117559

[51] Int. Cl.⁶ ....................................................... H05K 7/20
[52] U.S. Cl. .......................... 361/704; 361/749; 361/803; 257/723; 174/254
[58] Field of Search ..................................... 361/704, 728, 361/749, 789, 803, 816, 784, 730; 257/686, 685, 723, 724, 692; 174/35 R, 254, 52.4, 52.1; 29/604, 830, 829; 428/209, 137

[56] References Cited

U.S. PATENT DOCUMENTS

| | | |
|---|---|---|
| 3,218,615 | 11/1965 | Reimer et al. . |
| 3,492,538 | 1/1970 | Fergusson ............................... 361/803 |
| 3,766,439 | 10/1973 | Isaacson ................................... 317/100 |
| 3,819,989 | 6/1974 | Braune ................................. 317/101 F |
| 3,971,127 | 7/1976 | Giguere et al. . |
| 4,587,594 | 5/1986 | McPherson . |
| 4,823,233 | 4/1989 | Brown et al. . |
| 4,858,073 | 8/1989 | Gregory . |
| 4,969,066 | 11/1990 | Eibl et al. . |
| 5,016,138 | 5/1991 | Woodman . |
| 5,121,297 | 6/1992 | Haas . |
| 5,218,516 | 6/1993 | Collins et al. . |
| 5,235,491 | 8/1993 | Weiss . |

FOREIGN PATENT DOCUMENTS

| | | |
|---|---|---|
| 490 530 A2 | 6/1992 | European Pat. Off. . |
| 244 671 A1 | 4/1987 | German Dem. Rep. . |
| 1 932 380 | 1/1971 | Germany . |
| 24 51 211 A1 | 6/1975 | Germany . |
| 28 43 710 B2 | 4/1979 | Germany . |
| 81 30 300 U1 | 1/1981 | Germany . |
| 33 21 320 C2 | 12/1983 | Germany . |
| 33 30 466 A1 | 3/1984 | Germany . |
| 85 05 220 U1 | 5/1985 | Germany . |
| 35 36 963 C2 | 4/1987 | Germany . |
| 39 42 392 C2 | 6/1990 | Germany . |
| 41 32 875 A1 | 4/1993 | Germany . |
| 42 25 358 A1 | 2/1994 | Germany . |
| 43 33 387 A1 | 3/1994 | Germany . |
| 43 03 908 A1 | 8/1994 | Germany . |
| 44 46 594 A1 | 6/1996 | Germany . |

OTHER PUBLICATIONS

IBM Technical Disclosure Bulletin, vol. 38 No. 06 Jun. 1995 Stackable Flex Packaging of Chips, p. 1.
IBM Technical Disclosure Bulletin, vol. 38, No. 01, Jan 1995; Three–Dimensional High Density Packaging, pp. 69–70.

*Primary Examiner*—Leo P. Picard
*Assistant Examiner*—Michael Datskovsky
*Attorney, Agent, or Firm*—Griffin, Butler, Whisenhunt & Szipl, LLP

[57] ABSTRACT

Three-dimensional flexible electronic module consists of unpackaged electronic components, packaged electronic components and microboards with unpackaged active and passive electronic components. The module can contain different transducers and receiver-transmitter system. Unpackaged electronic components, packaged electronic components and microboards besides interconnections are electrically connected one to another by the means of flexible corrugated commutation boards having variable cross-section. Every heat emitting component is obtained by a heat sink, having a heat contact with external flexible cover of the module. Repairability of the module in the case of any component failure is provided.

The being proposed construction, having all the advantages of three-dimensional modules (first of all, high packing density), is able to change its shape: be compressed and strained, bended in every direction without any change in functional properties.

The invention has a broad area of applying, particularly for creating miniature robotics saving complexes in medical equipment.

11 Claims, 3 Drawing Sheets

FIG.5A FIG.5B FIG.5C
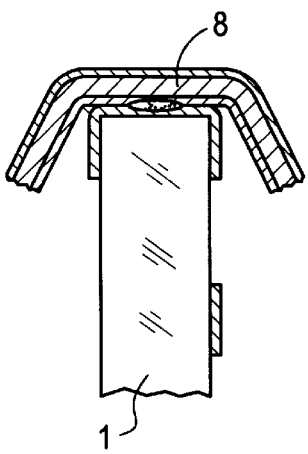 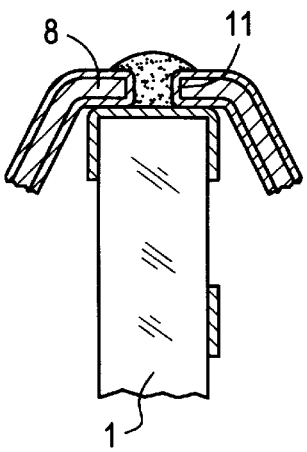 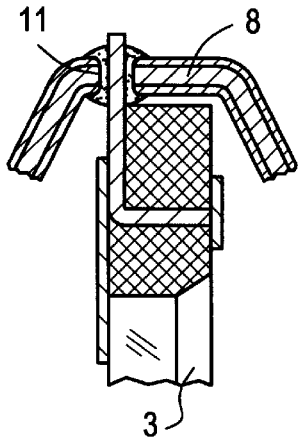
FIG.5D FIG.5E
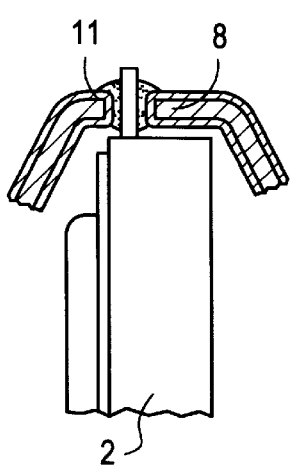 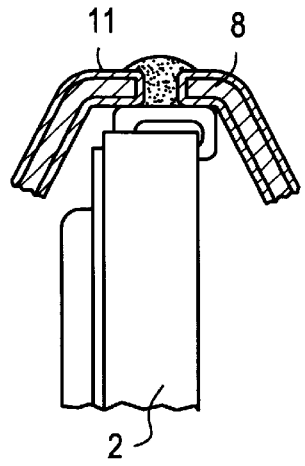
FIG.6 FIG.7 FIG.8
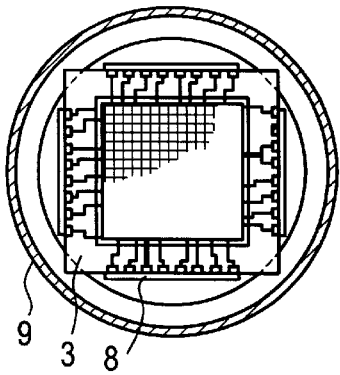 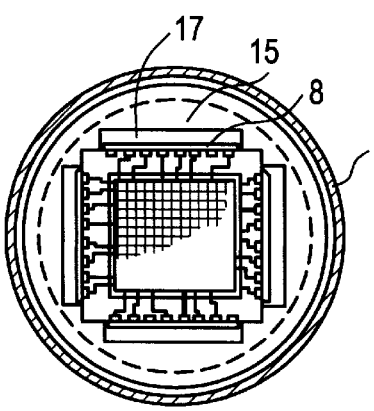 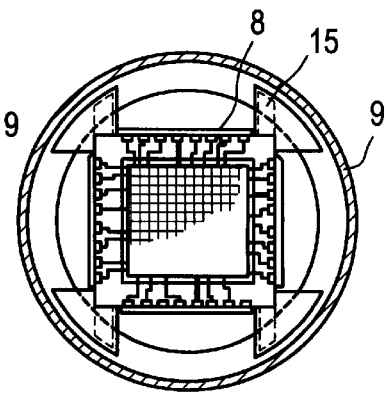

THREE-DIMENSIONAL FLEXIBLE ELECTRONIC MODULE

This invention relates to an area of creating three-dimensional electronic devices, concretely to three-dimensional flexible electronic modules design.

It is known a construction of electronic module, having flexible printed circuit board with means of heat removal according to U.S. Pat. No. 3,766,439 HO5K 7/20 Oct. 16. 1973.

A component of electronic circuit, having advantage particularly in the case of multilayer board construction, fabricated mainly of a flexible dielectric, used as a board's base, with deposited copper, covering the dielectric sheet before conductors etching. The conductors are separated according to their disposal along axises X and Y so that the conductors on each side of dielectric are parallel only to one axis. Connection between a commutations along axises X, Y is realized by the means of metallized vias, those can be connected with the circuit's elements. Planar IC are connected to the board, oriented by their top to the board and by heat conductive base—to opposite side. Arranging all the planar (SMD) packages to one side of flexible board and turning the board to a loop, allows to achieve high circuit components density with heat emitting parts of planar packages oriented to external sides of the structure's loops, providing the arrangement of planar packages in heat contact with an external cover.

The said construction can be considered as three-dimensional only relatively, because it contains a conventional printed circuit board, turned to the loop. At this time applying a multi-layer printed circuit board is practically inevitably. The construction is stationary and doesn't allow to make any arbitrary bending. An advantage of the said construction is an effort to realize an effective heat removal from the heat emitting components to the external cover. It is also known a construction of flexible dice packing to a stack according to information of IBM corp. (Technical Disclosure Bulletin, Vol. 38, N 06, June 1995).

The dice of semiconductor devices are connected with flexible ribbon carriers by wire leads or dice connectors and stacked for density packing and connection on the next level. As examples of many high density packing configurations, using a base method of the dice mounting to the flexible commutation board it is possible to give the following:

Semiconductor dice are connected to a linear array and are mounted to both sides of a flexible ribbon. In this case the flexible commutation with the mounted dice can take a shape of a stack. Heat conductive ribbon or protective compound can be used for the stack's fixing, and leads can go out of stack for the commutations on the next level. The wider ribbon with several dice rows, disposed similarly, can be used to the larger dice stacks. In another variant the ribbon can be cross-shaped with the dice disposalon the one its side. The several these cross-shaped ribbons are bent, forming the stack with the dice arrangement—one upper another, in this case every section has external leads, going out of the stack.

The dice disposal on the both sides of the ribbon can't be considered as successful decision, because it makes difficulties during designing layout and repairing of the construction. Besides it this construction is also planar, turned to the loop. And the second variant is parallel disposal of sections, not coupled one to another. The supposed constructions additionally possess all shortcomings similar to the construction, described in the U.S. Pat. No. 3,766,439.

It is known the assembly of a commutation board according to U.S. Pat. No. 3,819,989 HO5K 1/04 dated Jun. 25. 1974. The subject of patenting is the commutation board's assembly, connecting a plurality of circuits and fabricated of a single unit, the flexible ribbon, carrying a plurality of conductors, going out to circuits, disposed on the circuit boards. The boards are disposed at the right angle to the main ribbon at the ends of loops, carrying the conductors, branching off to the board's circuit. The loops of the ribbon are folded and secondary folded so that the boards remain on mutually parallel planes at the right angle to the main ribbon.

The said construction can be realized using simple technology, because all substrates and commutation base are fabricated of a single unit. But this construction can't be considered as completed, because it doesn't provide elements of mechanical hardness, heat removal and another building elements.

The most close analogue of the present invention is construction, described in the U.S. Pat. No. 3,766,439.

The aim of present invention is creating miniature electronic devices, possessing all the advantages of three-dimensional modules and at the same time being able to have arbitrary shape without any degradation of functional properties and provided an effective heat removal and repairability.

This problem is being solved so, that three-dimensional electronic module, containing a plurality of packaged and/or unpackaged electronic components, connected one to another electrically by the means of commutation boards, turned by one surface to edges of packaged and/or unpackaged electronic components and/or microboards, housed into an external cover, according to the invention, has commutation boards, implemented, mainly, as corrugated flexible printed circuit boards with alternating widenings and narrowings, besides it, points of contacting with bonding pads or hard leads of the packaged and/or unpackaged electronic components and/or microboards, disposed on their edge surfaces, are located at the widened zones, and narrowed zones are disposed at the places between the packaged and/or unpackaged electronic components and/or microboards, in this case the narrowed zones of commutation boards, disposed on different sides of three-dimensional flexible electronic module, have a shape, providing their non-contact; the length of the commutation boards narrowed zones is selected sufficient for compressing, straining, bending in arbitrary plane and limited rotation around a longitudinal axis without damaging electric connections between the module's parts.

The essence of present invention consists in that the packaged, unpackaged electronic components and microboards have on the edge surfaces bonding pads or hard leads. In addition to it the packaged, unpackaged electronic components and microboards are electrically connected one to another by the means of commutation boards, implemented, mainly, as the configurated flexible printed circuit boards.

The commutation boards have alternating widened and narrowed zones. As a rule, there are metallized apertures and vias at the widened zones, provided for the contacting with the packaged, unpackaged electronic components and microboards and for connection the conductors, disposed on the opposite sides of the board. The narrowed zones are disposed between the packaged and/or unpackaged electronic components and/or microboards and are located in a gap between them. Narrowing is necessary for providing non-contact of the commutation boards and for preventing difficulties during an arbitrary bend of construction, even if a packing density of the packaged and/or unpackaged electronic components and/or microboards is high.

Dimensions of commutation boards narrowed zones must be minimum to reduce the length of interconnections, but sufficient for normal function of the three-dimensional flexible electronic module.

Different constructions of heat sinks are provided for effective heat removal from heat emitting components. These heat sinks have direct heat contact with the component and passing through the gap between commutation boards have heat contact with external cover.

A direct heat contact of the packaged, unpackaged electronic component or the microboard with the external cover through the gap, formed between commutation boards id also possible. In this case substrate of the packaged, unpackaged electronic component or the microboard must be made using heat conductive material and must have good electric insulation in zones of contact with the external cover.

The external cover can be made, for example, as a metallic sylphone. A variant having multi-link cover is also possible, but in this case it is necessary to provide a good.heat contact between the links of cover during the arbitrary bend of the construction.

In order to provide heat removal and repairability of the construction a size of commutation board in its widest zone advisable must be a little less that a size of the conjugated packaged, unpackaged electronic component or microboard. This allows before the mounting of three-dimensional module into the external cover to extract defective unpackaged electronic component or microboard, preliminary unsoldering them from the commutation board and moving apart the construction in this place. At the same time the gap, formed between commutation boards, disposed on different planes, is necessary for passing the heat sink from the packaged, unpackaged electronic component or microboard to the external cover.

The construction of the said three-dimensional flexible electronic module can be successfully applied as an autonomous device. In order to do it, various transducers can be included to its structure (such as CCD-structures, medical transducers e.t.c.) and also elements of radio receiver and radio transmitter. In this case it is advisable to apply additionally autonomous power supply. All these units can be comparatively simply realized as a set of microboards and unpackaged electronic components. In the case when it is necessary the mounting of tools is made additionally (for taking samples, making operations e.t.c.).

A variant when connection with external devices and power supply are made using separate flexible cable is possible too. In this variant an electronic circuitry of the three-dimensional flexible electronic module significantly simplifies, but potential possibilities of the module decrease.

The structure of the construction can also include an electric motor, a system of drive and movement conversion, but all this is realised by conventional decisions and isn't a part of this description.

Further the proposed invention is explained by concrete examples of its implemention.

FIGS. 5a, 5b, 5c, 5d, 5e show variants of electric connections of three-dimensional electronic module's part according to the invention;

FIG. 6 shows a variant of heat removal directly from microboard according to the invention;

FIG. 7 shows a variant of heat removal through a round part according to the invention;

FIG. 8 shows a variant of heat removal through projections according to the invention.

Figure 1:
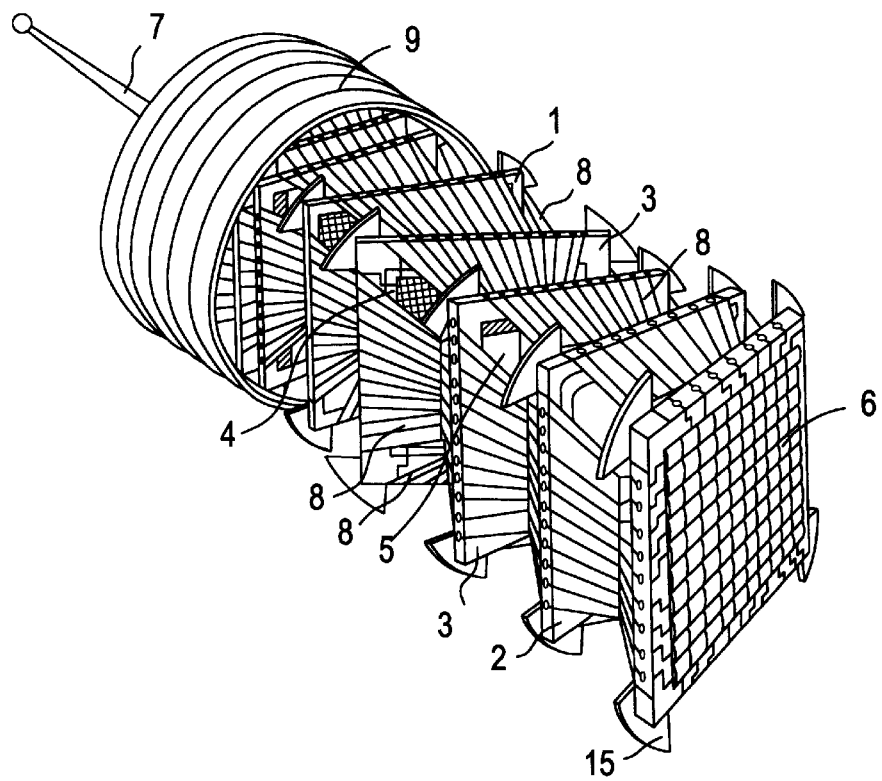
FIG. 1 shows a variant of common view of three-dimensional flexible electronic module according to the invention.

The being proposed three-dimensional flexible electronic module (see FIG. 1) consists, mainly, of unpackaged electronic components 1, packaged electronic components 2, microboards 3 with active 4 and passive 5 electronic components. Various transducers 6 and the system of receiver-transmitter 7 can be included into the module's stricture. Unpackaged electronic components 1, packaged electronic components 2 and microboards 3 are electrically connected by the means of corrugated commutation boards 8. All the construction is included into the external cover 9.

Figure 2:
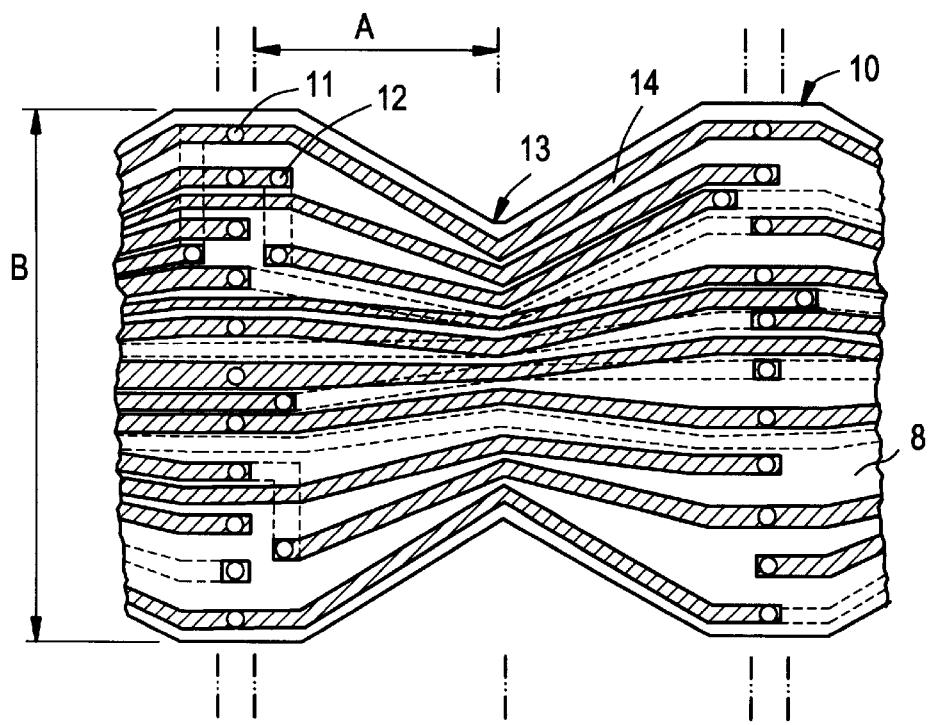
FIG. 2 shows a size of common board's reamer according to the invention.

The commutation board 8 (see FIG. 2) has variable cross-section. There are metallized apertures 11 at the widened zone 10 for the connecting with the bonding pads or hard leads of unpackaged electronic components 1, packaged electronic components 2 or microboards 3, and also metallized vias 12 for the connecting layers of commutation board's layout. There are mainly only conductors 14 at the narrowed zone 13 of the commutation board 8.

The size A is selected minimum to reduce interconnections length, but sufficient to provide flexibility of the construction. The size B must be less than corresponding size of adjacent to the commutation board 8 unpackaged electronic components 1, packaged electronic components 2 and microboards 3. The commutation board 8, if it is necessary, can be multi-layer. A stroke-dotted line shows places of commutation board 8 bend.

Figure 3:
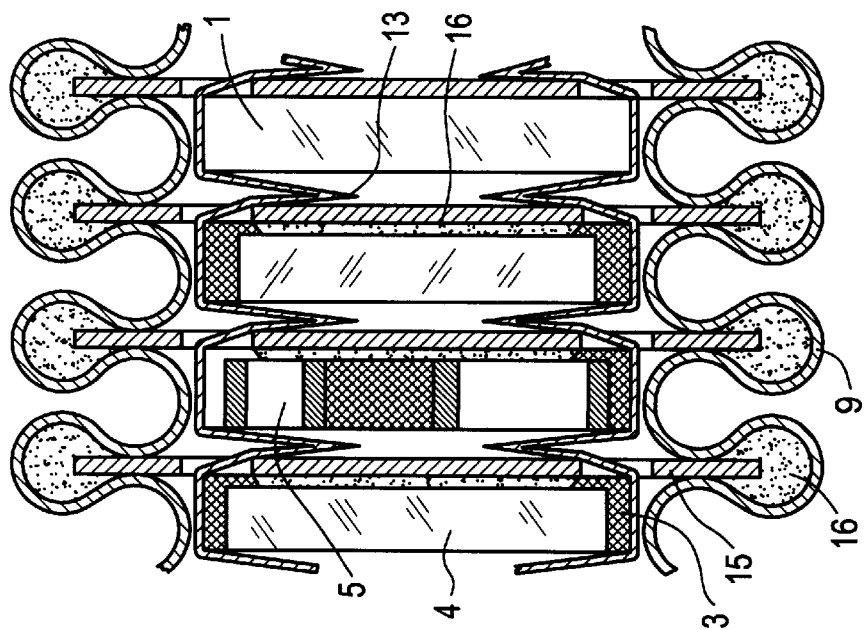
FIG. 3 shows a fragment of a longitudinal section of the three-dimensional flexible electronic module in compressed state according to the invention.

In the case of maximum construction's compression (see FIG. 3) the unpackeged electronic components 1, packaged electronic components 2 and microboards 3 must not touch each other, and narrowed zones 13 of the commutation board 8 are disposed in the gaps between them. In order to avoid short circuits the commutation board 8 is insulated on both sides by elastic material except metallized apertures 11. Heat removal from the unpackaged electronic component 1, packaged electronic components 2 and from active 4 and passive 5 components inside the microboards 3 is realized through a heat sink 15, heat conductive material 16 to the external cover 9.

Figure 4:
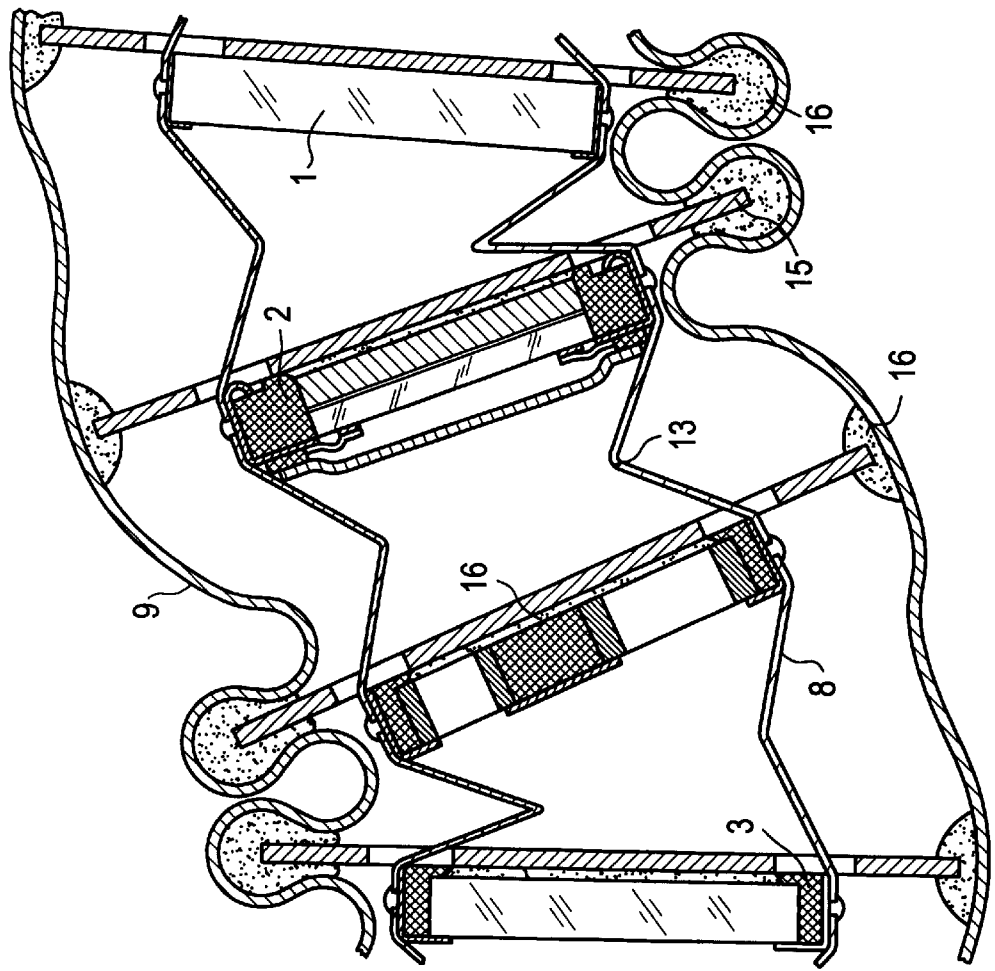
FIG. 4 shows a fragment of a longitudinal section of the three-dimensional flexible electronic module during arbitrary bend according to the invention.

In the case of arbitrary construction's bend (see FIG. 4) the narrowed zones 13 of the commutation board 8 partly straighten, but provide an electric integrity of the construction. At the same time heat removal to the external cover 9 decreases a little as a result of this straightening. Applying the packaged electronic components 2 decreases the general packing density of the construction.

The FIG. 5 shows different methods of contacting packaged 2, unpackaged 1 electronic components and microboards 3 with the commutation board 8. FIG. 5a shows a variant of electric connection between flexible commutation board 8 and a bonding pad of unpackaged electronic component 1 or microboard 3 using method of soldering or welding through an insulating base of the commutation board 8. The FIG. 5b shows a variant of electric commutation of the flexible commutation board 8 with the bonding pad of the unpackaged electronic component 1 or microboard 13 using method of soldering to the metallized aperture 11 of the commutation board 8. The FIG. 5c shows a variant of electric connection between the flexible commutation board 8 and a bonding pad of a frame microboard 3 variant using the method of soldering via the through metallized aperture 11 of the commutation board 8. A variant similar to the foregoing, but for the connection of packaged component 2 through the metallized aperture 11 in the commutation board 8 is shown in FIG. 5*d*. The FIG. 5*e* shows a variant of electric commutation between the flexible commutation board 8 and external contact of the packaged component 2, the contact having a shape like J, using the soldering to the metallized aperture 11 of the commutation board 8; this connection can be implemented also using the method, shown in the FIG. 5*a*.

A direct heat removal from the packaged 2 or unpackaged 1 electronic component or from the microboard 3 is shown in FIG. 6. In this case corners of the packaged 2 or unpackaged 1 electronic component or microboard 3 pass through a gap, formed by the commutation boards 8, and have a heat contact with the external cover 9. A square of the heat contact is relatively small, therefore this mode can be recommended in the case of small heat emitting (parts of watt). In this variant the corners of packaged 2, unpackaged 1 electronic components or microboards 3 must be electrically insulated, and their substrates must be made of well heat conductive material. The construction is repairable before mounting into the external cover 6.

A very good heat removal can be achieved by applying a round heat sink (see FIG. 7). In this case the heat sink 15 has windows 17, the commutation boards 8 passing through this windows. But such construction is repaired with difficulties, and mounting into the external cover 9 requires special tooling.

FIG. 8 shows a variant of using projections on the heat sink 15, having a heat contact with the external cover 9. The heat removal is a little worse then in FIG. 7, but assembling is easier. In the case of decreasing the projections to sizes, shown by a stroke-dotted line, a good repairability is provided.

The present invention significantly expands spheres of three-dimensional constructions applying. So, it is possible to apply the present construction for penetrating into difficult accessible places like obstructions for discovering people and for inspection and operation of an patient's alimentary canal.

I claim:

1. Three-dimensional flexible electronic module, containing a plurality of packaged and/or unpackaged electronic components and/or microboards with disposed inside them unpacked electronic components, connected one to another by commutation boards, sided by one surface to edges of packaged and/or unpackaged electronic components and/or microboards, packaged into an external cover, differing so that the commutation boards are realized, mainly, as corrugated flexible printed circuit boards with alternating widenings and narrowings, in addition to it there are the widened zones containing points with bonding pads or hard leads of packaged and/or unpackaged electronic components and/or microboards, disposed on their edge surfaces, and the narrowed zones are disposed at the places between packaged and/or unpackaged electronic components and/or microboards, in addition to it the narrowed zones of the commutation boards, disposed on the different sides of the three-dimensional flexible electronic module, have a shape, providing their non-contact to each other; a length of the commutation boards narrowed zones is selected sufficient for compression, strain, bend in every plane and limited rotation of the three-dimensional flexible electronic module around its longitudinal axis without damaging the electric connections between the module's parts.

2. Three-dimensional flexible electronic module according to claim 1, differing so that the module's cover is implemented as flexibleheat conductive construction.

3. Three-dimensional flexible electronic module according to claim 1, differing so that at least one electronic component and/or microboard has through the zone disposed in the gap between the commutation boards the heat contact with the external cover of the three-dimensional flexible electronic module, made mainly as a flexible heat conductive construction.

4. Three-dimensional flexible electronic module according to claim 1, differing so that at least one electronic component and/or microboard contains the heat sink going to the gap between commutation boards and having the direct heat contact both with the heat generating component and the external cover of the three-dimensional flexible electronic module.

5. Three-dimensional flexible electronic module according to claim 1, differing so that a substrate of the packaged and/or unpackaged electronic component and/or of the microboard is made mainly of the heat conductive material.

6. Three-dimensional flexible electronic module according to claim 1, differing so that the width of commutation boards is selected a little less than the width of the packaged or unpackaged electronic components or microboards in order to provide a gap between commutation boards sufficient for the extraction of the packaged or unpackaged electronic component or microboard in case of their changing (before the mounting into the external cover) during the maximum moving apart the connected packaged and/or unpackaged electronic components and/or microboards.

7. Three-dimensional flexible electronic module according to claim 1, differing so that at least are unpackaged electronic component or microboard, disposed at the edge of the three-dimensional flexible electronic module, contains at least one transducer, sensitive to the environment conditions.

8. Three-dimensional flexible electronic module according to claim 1, differing so that at least one packaged and/or unpackaged component and/or microboard contains the transmitting device for the communication with the external receiver.

9. Three-dimensional flexible electronic module according to claim 1, differing so that at least one packaged and/or unpackaged component and/or microboard contains the receiver for the communication with the external transmitter.

10. Three-dimensional flexible electronic module according to claim 1, differing so that at least one microboard, disposed at the edge of the three-dimensional flexible electronic module, contains at least one actuator for the mechanical or other physical actions.

11. Three-dimensional flexible electronic module according to claim 1, differing so that it contains the autonomous power supply, made as one or several microboards.

\* \* \* \* \*